US010412863B2

United States Patent
Elias et al.

(10) Patent No.: US 10,412,863 B2
(45) Date of Patent: Sep. 10, 2019

(54) CHARGING DEVICE FOR INDUCTIVELY CHARGING AN ELECTRICAL ENERGY STORE OF A MOTOR VEHICLE AND METHOD FOR OPERATING A CHARGING DEVICE

(71) Applicant: AUDI AG, Ingolstadt (DE)

(72) Inventors: Björn Elias, Hepberg (DE); Reinhard Peer, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 71 days.

(21) Appl. No.: 15/574,581

(22) PCT Filed: May 12, 2016

(86) PCT No.: PCT/EP2016/060779
§ 371 (c)(1),
(2) Date: Nov. 16, 2017

(87) PCT Pub. No.: WO2016/184791
PCT Pub. Date: Nov. 24, 2016

(65) Prior Publication Data
US 2018/0160572 A1 Jun. 7, 2018

(30) Foreign Application Priority Data

May 16, 2015 (DE) ........................ 10 2015 006 308

(51) Int. Cl.
*H05K 7/20* (2006.01)
*H02J 7/00* (2006.01)
(Continued)

(52) U.S. Cl.
CPC .......... *H05K 7/20945* (2013.01); *B60L 53/12* (2019.02); *B60L 53/38* (2019.02);
(Continued)

(58) Field of Classification Search
CPC ........ H02J 7/0042; H02J 7/1453; H02J 7/025; H02J 5/005; H02J 17/00; H02J 50/10; H02J 50/12; H05K 7/20945; B60L 53/12–126
(Continued)

(56) References Cited

U.S. PATENT DOCUMENTS

| 5,248,215 A | 9/1993 | Fladung |
| 6,676,122 B1 * | 1/2004 | Wobben .................. F03D 80/60 290/55 |

(Continued)

FOREIGN PATENT DOCUMENTS

| DE | 4236286 A1 | 5/1994 |
| DE | 10000370 A1 | 7/2001 |

(Continued)

OTHER PUBLICATIONS

Machine translation of WO-2010098412-A1 (Year: 2019).*
(Continued)

*Primary Examiner* — David V Henze-Gongola
(74) *Attorney, Agent, or Firm* — Maier & Maier, PLLC

(57) ABSTRACT

A charging device for inductively charging an electrical energy store of a motor vehicle, having a primary coil, which is designed for inducing a voltage in a secondary coil of the motor vehicle for charging the electrical energy store; and having a lifting mechanism, which is designed for moving the primary coil between a stowage position and a charging position. The charging device has a fan unit, which is arranged in such a way that an air flow that can be produced by the fan unit flow around a power electronics of the charging device, and subsequently flows to the lifting mechanism.

6 Claims, 1 Drawing Sheet

(51) Int. Cl.
  *B60L 53/12* (2019.01)
  *B60L 53/38* (2019.01)
(52) U.S. Cl.
  CPC ......... *H02J 7/0042* (2013.01); *B60L 2240/70* (2013.01); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/14* (2013.01)
(58) Field of Classification Search
  USPC .......................................... 320/108; 307/104
  See application file for complete search history.

(56) References Cited

U.S. PATENT DOCUMENTS

| | | | |
|---|---|---|---|
| 2009/0011616 A1 | 1/2009 | Patwardhan | |
| 2010/0308768 A1 | 12/2010 | Dower | |
| 2011/0199047 A1 | 8/2011 | Fujii | |
| 2012/0305662 A1* | 12/2012 | Miyano | H02J 7/00 236/44 C |

FOREIGN PATENT DOCUMENTS

| | | | | |
|---|---|---|---|---|
| DE | 10258610 | A1 | 6/2004 | |
| DE | 102009023175 | A1 | 12/2010 | |
| DE | 102010044999 | A1 | 3/2012 | |
| DE | 102011118397 | A1 | 5/2012 | |
| DE | 102011076186 | A1 | 11/2012 | |
| DE | 102012208005 | A1 | 11/2013 | |
| DE | 102013100019 | A1 | 7/2014 | |
| EP | 0788212 | A2 | 8/1997 | |
| EP | 2102496 | A1 | 9/2009 | |
| FR | 2785307 | A1 | 5/2000 | |
| WO | 2010098412 | A1 | 9/2010 | |
| WO | WO-2010098412 | A1 * | 9/2010 | ............ H01M 10/44 |
| WO | 2011/006884 | A2 | 1/2011 | |
| WO | 2011079215 | A2 | 6/2011 | |
| WO | 2013/081542 | A1 | 6/2013 | |

OTHER PUBLICATIONS

English translation of International Preliminary Report on Patentability, dated Nov. 30, 2017, of corresponding International Application No. PCT/EP2016/060779; 8 pgs.

International Search Report (English version) dated Aug. 5, 2016 from corresponding International Application No. PCT/EP2016/060779 (16 pages).

German Examination Report dated Jan. 21, 2016 from corresponding German Application No. 10 2015 006 308.01 (7 pages).

* cited by examiner

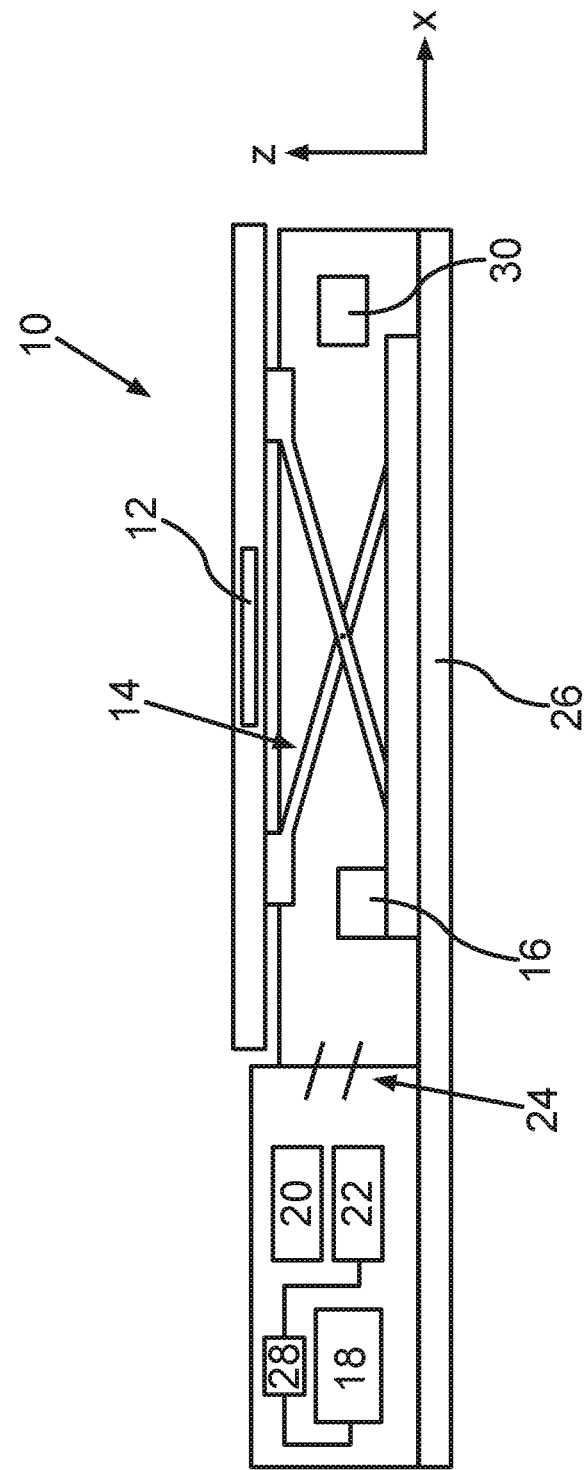

CHARGING DEVICE FOR INDUCTIVELY CHARGING AN ELECTRICAL ENERGY STORE OF A MOTOR VEHICLE AND METHOD FOR OPERATING A CHARGING DEVICE

FIELD

The invention relates to a charging device for inductively charging an electrical energy store of a motor vehicle of the kind indicated in the preamble of patent claim 1. Furthermore, the invention relates to a method for operating such a charging device.

BACKGROUND

WO 2011/006884 shows a charging device for inductively charging an electrical energy store of a motor vehicle. The charging device comprises a primary coil, which is designed for the purpose of inducing a voltage in a secondary coil of the motor vehicle for charging the electrical energy store. A supply electronics is disposed underneath the primary coil, in the same housing as the primary coil. Housing fans that are arranged inside the housing provide for an air cooling.

DE 10 2010 044 999 A1 also shows a charging device for inductively charging an electrical energy store of a motor vehicle. Heat energy, which arises in a coil on the vehicle side or in a charging unit on the vehicle side due to power loss, is utilized by means of heat transport means, at least partially, for heating the electrical energy store of the motor vehicle, if the temperature of the electrical energy store lies below a lower limiting temperature.

DE 10 2011 076 186 A1 also shows a charging device for inductively charging an electrical energy store of a motor vehicle. The charging device comprises a primary coil, which is designed for the purpose of inducing a voltage in a secondary coil of the motor vehicle for charging the electrical energy store. Moreover, the charging device comprises a lifting mechanism, which is designed for the purpose of moving the primary coil between a stowed position and a charging position. In this case, the primary coil is arranged in a movable bottom induction plate, which can be moved by means of the lifting mechanism. It is possible in this case to conduct air heated by means of a heating element onto the top of the bottom plate by means of a fan.

In charging devices with such a lifting mechanism, problems may occur with the lifting mechanism at temperatures around or below the freezing point and especially during wet weather, as well as with a wet lifting mechanism. In particular, when moving parts of the lifting mechanism, such as joints, movable struts, bellows or the like freeze up, a trouble-free activation of the lifting mechanism may be restricted or even prevented. This may significantly restrict the efficiency during the inductive charging of an energy store of a motor vehicle or even make the charging process itself impossible under certain conditions, since the primary coil can no longer be moved into the charging position, in which a gap between the primary coil and the secondary coil is as small as possible, when the lifting mechanism is iced up.

SUMMARY

The object of the present invention is to provide a charging device as well as a method for operating a charging device, by means of which a reliable inductive charging of an electrical energy store of a motor vehicle can be assured even during winter weather conditions.

This object is achieved by a charging device as well as by a method for operating a charging device with the features of the independent patent claims. Advantageous embodiments with expedient and nontrivial enhancements of the invention are indicated in the dependent claims.

The charging device according to the invention for inductively charging an electrical energy store of a motor vehicle comprises a primary coil, which is designed to induce a voltage in a secondary coil of the motor vehicle for the charging of the electrical energy store. The charging device furthermore comprises a lifting mechanism, which is designed to move the primary coil between a stowage position and a charging position. In order to ensure a reliable and especially weather-independent functioning of the lifting mechanism of the charging device, it is provided according to the invention that the charging device has a fan unit, which is arranged in such a way that an air flow that can be generated by means of the fan unit flows around a power electronics of the charging device and subsequently flows to the lifting mechanism. Waste heat generated by the power electronics during operation can thus be transported by means of the air flow to the lifting mechanism, since the air flow produced by the fan unit is heated by flowing around the power electronics and after this flows to the lifting mechanism. In this case, the power electronics can have the most diverse components and circuits in order to operate, in particular, the primary coil of the charging device. The components may involve, for example, power converters, or also components that serve to switch the primary coil on and off. Moreover, the power electronics can also serve for operating a drive unit of the lifting mechanism.

Due to the fact that the charging device has the fan unit, which is arranged in such a way that an air flow that can be generated by means of the fan unit flows around the power electronics of the charging device and subsequently flows to the lifting mechanism, the waste heat of the power electronics can be used for the purpose of avoiding an icing of the lifting mechanism. In particular, moving parts and parts that move relative to one another of the lifting mechanism, even in unfavorable weather conditions, thus at temperatures around or below the freezing point and with a relatively high humidity as well as high moisture in the lifting mechanism can be kept reliably free of ice or, if needed, can be de-iced thereby. Therefore, the charging device can also be reliably operated under winter conditions, since the lifting mechanism can be kept free of ice and thus functional due to the waste heat that can be supplied by the power electronics.

Preferably, an air conducting device is arranged downstream in the flow direction of the air flow that can be generated, after the power electronics and in front of the lifting mechanism. By means of the air conducting device, the air flow, which is produced by means of the fan unit and which has already been heated by flowing around the power electronics, can be directed particularly well onto the lifting mechanism, and, in particular, onto parts of the lifting mechanism that are in danger of icing. In this way, a reliable functioning of the lifting mechanism can be assured even at temperatures around or below the freezing point and with relatively high humidity as well as high moisture in the lifting mechanism.

An advantageous embodiment of the invention provides that the charging device has a heating unit, which is arranged in such a way that the air flow that can be generated by means of the fan unit flows around the heating unit and subsequently flows to the lifting mechanism. In this case, for example, the heating unit can be arranged in the direction of flow after the power electronics. Here, there would be the advantage that when the fan unit is switched on, the air flow heated by flowing around the heating unit does not additionally heat the power electronics. Alternatively, it is also possible that the heating unit and the power electronics are arranged parallel in the flow direction in such a way that the heating unit does not heat the power electronics. Preferably, the air conducting device, which has already been mentioned above, is arranged here after the heating unit and in front of the lifting mechanism, downstream in the flow direction of the air flow that can be produced. The mentioned air flow, after flowing around the heating unit, can also be particularly well channeled in this way, and can be directed onto the lifting mechanism, and, in particular, onto the parts of the lifting mechanism that are in danger of icing. Providing the heating unit brings with it the advantage that the lifting mechanism can then also be reliably heated or warmed up, when the power electronics is not operating and no waste heat is produced. The heating unit can thus be activated and deactivated as needed, so that the lifting mechanism can be kept ice-free and thus functional. The heating unit may involve, for example, current-locked heating wires, by way of which the air flow produced by the fan unit can be conveyed.

Another advantageous embodiment of the invention provides that the charging device has a control unit, which is designed for the purpose of operating the fan unit or the fan unit and the heating unit as a function of supplied weather data, in particular with respect to the ambient temperature and the ambient humidity. The charging device may have, for example, a sensor device for this, for supplying the weather data. The sensor device can be designed, for example, for the purpose of detecting the temperature in the direct vicinity of the lifting mechanism and the humidity in the direct vicinity of the lifting mechanism, and to provide the corresponding data to the control unit. Alternatively or additionally, it is also possible that the charging device comprises a communication unit for receiving the weather data. For example, the communication unit can be designed for the purpose of wirelessly receiving weather data that is available online, and supplying this data to the control unit, so that the latter can correspondingly control the heating of the lifting mechanism by means of the fan unit and/or the heating unit. In particular, when both the sensor device and said communication unit are provided, a particularly reliable functioning of the charging device can be made possible by the redundant supply of data with respect to the temperature and humidity, since corresponding weather data can be supplied at any time, as a function of which, a heating up of the lifting mechanism can be produced. An icing up of the lifting mechanism and, in particular, of moving parts or parts moving relative to one another of the lifting mechanism can thus be reliably prevented.

In another advantageous embodiment of the invention, it is provided that the control unit is designed to activate the fan unit or the fan unit and the heating unit for a predetermined time before an upcoming charging process. For example, vehicle-specific information may be exchanged with the charging device via a communication system. When a motor vehicle is in the vicinity of the charging device or approaches the charging device, the control unit can receive a corresponding signal. In this case, it is likely that a charging process for the particular motor vehicle, more precisely the electrical energy store of the particular motor vehicle, will soon take place by means of the charging device. Even before the actual charging process begins, the fan unit or the fan unit and the heating unit will be actuated by means of the control unit, so that the possibly already iced or partly iced lifting mechanism is de-iced. It may thus be assured that an upcoming charging process can in any case be performed with no problem.

Another advantageous embodiment of the invention calls for the control unit to be designed to activate the fan unit or the fan unit and the heating unit if a force, which is greater than a predetermined force value, is exerted to move the lifting mechanism. For example, it may be provided that the control unit is connected to an electric motor, by means of which the lifting mechanism can be moved. In this way, the control unit can pick off information or data characterizing the force expended or required to directly move the lifting mechanism. The predetermined force value will be greater in this case than a force normally exerted to move the non-frosted lifting mechanism. But if a force, which is greater than the predetermined force value, is expended during the movement of the lifting mechanism, this might be an indication that the lifting mechanism is at least partly iced and therefore less easily moved than usual. Thus, it will be detected not later than when the lifting mechanism is moved whether or not the latter is iced. For this situation, the control unit is designed to activate the fan unit alone or the fan unit and the heating unit so that the lifting mechanism is de-iced as fast as possible and a reliable charging process can be assured by means of the charging device.

According to another advantageous embodiment of the invention, it is provided that the control unit is designed for the purpose of activating the fan unit or the fan unit and the heating unit, if a charging current goes below a predetermined charging current value during the charging of an electrical energy store of a motor vehicle. A reason for this could be that the lifting mechanism could not be moved completely from the stowed position into the final charging position, for example, since the lifting mechanism is iced up. For such a case, the control unit is designed for the purpose of activating the fan unit alone or the fan unit and the heating unit, so that the iced-up lifting mechanism, if need be, can be moved relatively rapidly into the desired or intended charging position and a particularly efficient charging process can be assured.

In another advantageous embodiment of the invention, it is provided that the control unit is designed for the purpose of activating and deactivating the fan unit or the fan unit and the heating unit at predetermined cyclical intervals. Depending on how much waste heat is still discharged from the power electronics after a charging process, it may be sufficient for a certain period of time to switch the fan unit on and off cyclically by itself, so that waste heat still discharged after the charging process can be directed onto the lifting mechanism. If, in contrast, a charging process should have ended some time before this, it may be expedient to additionally still activate and deactivate the heating unit, and likewise to activate and deactivate the fan. In this way, it can be assured, without a high measurement and control expense, that the lifting mechanism is kept free of ice. The above-named operating modes of the control unit for operating the fan unit and the heating unit can thus also be combined with each other.

In the method according to the invention for operating the charging device according to the invention or an advantageous embodiment of the charging device according to the invention, an air flow is produced by means of the fan unit, which flows around the power electronics and then flows to the lifting mechanism. Advantageous embodiments of the charging device according to the invention are also considered to be advantageous embodiments of the method according to the invention, wherein the charging device in particular comprises means for carrying out the steps of the method.

Further advantages, features and details of the invention will emerge from the following description of preferred exemplary embodiments, as well as based on the drawings. The features and combinations of features mentioned above in the description as well as the features and combinations of features named below in the description of the FIGURE and/or features and combinations of features shown solely in the FIGURE, may be used not only in the particular indicated combination, but also in other combinations or standing alone, without leaving the scope of the invention.

BRIEF DESCRIPTION

FIG. 1 shows a charging device for inductively charging an electrical energy store of a motor vehicle in a schematic side view, wherein the charging device comprises a lifting mechanism that is designed for the purpose of moving a primary coil of the charging device between a stowage position and a charging position.

A charging device 10 for inductively charging an electrical energy store of a motor vehicle, not shown here, comprises a primary coil 12, which is designed for the purpose of inducing a voltage in a secondary coil of a motor vehicle, not shown here, for the charging of the respective electrical energy store. In order to achieve an especially high efficiency in the charging process, it is important for the distance between the primary coil 12 and the secondary coil to be as small as possible. Therefore, the charging device 10 comprises a lifting mechanism 14, which is designed for the purpose of moving the primary coil 12 in the height direction z of the charging device 10, i.e., in the vertical direction, between the stowage position shown here and an extended charging position. Thus, by means of the lifting mechanism 14, it is possible to move the primary coil 12 closer to a secondary coil of the motor vehicle whose electrical energy store is to be inductively charged.

The lifting mechanism 14 may, for example, be designed as a scissors lift, as shown here schematically. But other configurations or principles of action of the lifting mechanism 14 are likewise possible. The charging device 10 comprises a drive 16 by means of which the lifting mechanism 14 can be moved back and forth between the stowage position shown here and the charging position extended in the height direction z. The lifting mechanism 14 comprises several moving parts, such as, for example, joints, struts, and the like, not characterized in detail here. Especially during winter weather conditions, i.e., temperatures around or below the freezing point and with relatively high humidity, the danger exists, among other things, that the components which can move relative to each other or moving components of the lifting mechanism 14 will freeze and thus a reliable functioning of the lifting mechanism 14 will be endangered.

In order to enable a reliable functioning of the lifting mechanism 14 even during winter weather conditions, i.e., to prevent a freezing of the lifting mechanism 14 and/or to enable a de-icing of the lifting mechanism 14, the charging device 10 comprises a fan unit 18, which is arranged in such a way that an air flow that can be generated by means of the fan unit flows around a power electronics 20 of the charging device 10 and a heating unit 22 of the charging device 10, and subsequently is conveyed to the lifting mechanism 14 via an air conducting device 24. The air flow thus heated in this case can also be partially conveyed to an aluminum bottom plate 26, on which the lifting mechanism 14 is arranged. Since the aluminum bottom plate 26 is a good heat conductor, it also well conveys the heat that is guided past by the air flow further to the lifting mechanism 14. The aluminum bottom plate 26 thus serves as a bottom plate of the charging device 10 and is formed as a housing part, based on properties that act positively on the magnetic field of the charging device 10 that is produced during the charging process. Since the aluminum bottom plate 26 is a good heat conductor, the waste heat of the power electronics 20 and the heating unit 22 can be transferred via the aluminum bottom plate 26 to the lifting mechanism 14. Preferably, however, the air conducting device 24 is designed and aligned so that the heated air flow can be directly conveyed, in particular, to critical or rapidly icing parts of the lifting mechanism 14.

During charging processes, the power electronics 20 necessarily develops a certain waste heat, so that an air flow, which is produced by the fan unit 18, can be heated when it flows around the power electronics 20 and subsequently can be conveyed to the lifting mechanism 14. With low temperatures and high humidity—thus when there exists a danger of icing of the lifting mechanism 14—the waste heat from the power electronics 20 that is conveyed to the lifting mechanism 14 via the air flow prevents an icing of the lifting mechanism 14 and/or de-ices components of the lifting mechanism 14 that are iced up.

For the case when a charging process does not occur and thus the power electronics 20 also does not produce any waste heat, the heating unit 22 can be activated, so that the air flow produced by the fan unit 18 can be heated when it flows around the heating unit 22 and can be conveyed to the lifting mechanism 14. Depending on weather conditions each time, however, it may also be expedient to additionally activate the heating unit 22 during the charging process, and thus during discharge of heat by the power electronics 20, in order to make possible a particularly high heating power and thus the heating of the lifting mechanism 14.

In addition, the charging device 10 comprises a control unit 28, which is designed for the purpose of actuating the fan unit 18 and the heating unit 22. Furthermore, the charging device 10 also comprises a sensor unit 30 for detecting the temperature and humidity. Alternatively or additionally, the charging device 10 can also have a communication unit, not represented here, by means of which online weather data can be received, for example.

The control unit 28 is designed for the purpose of operating the fan unit 18 or the fan unit 18 and the heating unit 22 as a function of the weather data supplied by the sensor device 30 and/or said communication unit. For example, it may be provided that a limit temperature, for example, of 2 degrees, 1 degree, or 0 degree is given in advance, wherein the fan unit 18 and the heating unit 22 will be automatically activated by means of the control unit 28, as soon as the temperature in the region of the charging device 10 should go below this limit temperature. Further, it may also be provided that the control unit 28 then activates the fan unit 18 and the heating unit 22, if the measured humidity in the region of the charging device 10 should be higher than a predetermined threshold value, and the temperature in the region of the charging device 10 lies below said limit temperature. The activation of the heating unit 22 in this case can be associated with whether the power electronics 20 is operating—thus a charging process occurs directly—or if the power electronics 20 has operated the last time. If the power electronics 20 is no longer operating, then also, it no longer discharges waste heat. In this case, it is expedient to activate the heating unit 22 in addition to the fan unit 18, in order to be able to direct a flow of hot air onto the lifting mechanism 14.

The control unit 28 may furthermore be designed to activate the fan unit 18 and the heating unit 22 at a predetermined time before an upcoming charging process. By a communication system, not designated in detail, the charging device 10 may, for example, be in communication with other motor vehicles being charged. For example, if one motor vehicle should approach the charging device 10 or be situated in the immediate vicinity, the control unit 28 may activate the fan unit 18 and the heating unit 22 as a precaution, so that the charging device 10 and especially the lifting mechanism 14 is functional and ice-free. For example, the control unit 28 may be designed to activate the fan unit 18 and the heating unit 22 five minutes or even ten minutes or even a few seconds before an assumed upcoming charging process. This predetermined time by which the fan unit 18 and the heating unit 22 are activated before an assumed upcoming charging process may be dictated in advance, for example, as a function of the heating capacity of the heating unit 22 and/or the detected ambient weather conditions of the charging device 10.

Moreover, the control unit 28 may also be designed to activate the fan unit 18 alone or the fan unit 18 together with the heating unit 22, if a force, which is greater than a predetermined force value, is exerted to move the lifting mechanism 14. The predetermined force value will preferably be chosen greater than a force normally needed to move the ice-free lifting mechanism 14. Thus, if upon activating or moving the lifting mechanism 14 to move the primary coil 12 from the stowage position to the charging position, a force, which is greater than the predetermined force value, is expended by means of the drive unit 16, this might be an indication that the lifting mechanism 14 is iced. As a result, the control unit 28 actuates the fan unit 18 alone or the fan unit 18 together with the heating unit 22 and activates the latter. If, now, during the heating of the lifting mechanism 14, it is detected that the force to be expended for the further movement of the lifting mechanism 14 is once more less than the predetermined force value, the control unit 28, as needed, may deactivate the fan unit 18 and/or the heating unit 22 once more or at least continue to operate it only for a short time, such as one minute or so.

In addition, the control unit 28 is designed for the purpose of activating the fan unit 18 alone or the fan unit 18 together with the heating unit 22, if a charging current should fall below a predetermined charging current value during the charging of an electrical energy store of a motor vehicle. This might be an indication that the lifting mechanism 14 could not be moved entirely to the charging position, for example, because certain moving parts or relatively movable components of the lifting mechanism 14 are iced up. For if the gap between the primary coil 12 and the respective secondary coil of the motor vehicle being charged should become too large, a reduced charging current will be established during the charging of the respective energy store of the motor vehicle. In such a situation, it may be provided that the heating unit 22 and the fan unit 18 are activated by the control unit 28 in order to make possible, if need be, a complete extension of the lifting mechanism 14 to the charging position. If the power electronics 20 should produce a sufficient amount of waste heat, it may also be enough to activate only the fan unit 18, so that the air flow that flows around the power electronics 20 de-ices the lifting mechanism 14.

Finally, it can also still be provided that the control unit 28 is designed for the purpose of activating and deactivating the fan unit 18 and the heating unit 22 at predetermined cyclical intervals. For the case when the power electronics 20 is operating and a certain amount of waste heat is produced, it may also be sufficient, at least as long as the power electronics 20 produces sufficient waste heat, to cyclically activate and deactivate fan 18 alone. The cyclical activation and deactivation of the fan unit 18 and/or the heating unit 22 can take place, for example, depending on weather, thus will be present, in particular, if minus degrees* are present and an increased humidity is detected. Due to the cyclical activation and deactivation of the fan unit 18 and the heating unit 22, it can be continuously assured that the lifting mechanism 14 is not iced up and thus the charging device 10 also can be kept continually functioning at frosty temperatures.

* i.e., minus degrees C.—Translator's note

In contrast to the schematic illustration shown here, according to which the power electronics 20 and the heating unit 22 are arranged parallel in the longitudinal direction x of the charging device 10 and thus are arranged above one another in the vertical direction z, the power electronics 20 and the heating unit 22 can also be arranged one after the other in the longitudinal direction x. In the latter case, it is advantageous if the heating unit 22 is arranged after the power electronics 20 in the flow direction. In this way, it is prevented that the air flow produced by the fan unit 18 first passes the heating unit 22 and after that passes the power electronics 20. In such a case, the air flow, which is already heated by flowing around the heating unit 22, would be conveyed to the power electronics 20. On the one hand, this would adversely affect the power electronics 20, and on the other hand, the already heated air flow might be cooled by the power electronics 20, and would not absorb additional heat from the power electronics 20. If, in contrast, the heating unit 22 is arranged after the power electronics 20 in the flow direction, then the at first relatively cold air flow can absorb a relatively large amount of waste heat from the power electronics 20, and subsequently can pass the heating unit 22, which usually generates still more heat than the power electronics 20. During the flow around the heating unit 22, due to the still relatively large temperature difference between the air flow that is already heated by flowing around the power electronics 20 and the temperature of the heating unit 22, still more heat can be absorbed by means of the air flow and then can be conveyed to the lifting mechanism 14.

The invention claimed is:

1. A charging device for inductively charging an electrical energy store of a motor vehicle, comprising:
   a primary coil, which is designed for inducing a voltage in a secondary coil of the motor vehicle for charging the electrical energy store;
   a lifting mechanism which is designed for moving the primary coil between a stowage position and a charging position,
   a fan unit, which is arranged in such a way that an air flow that can be produced by means of the fan unit flows around a power electronics of the charging device and subsequently flows to the lifting mechanism,
   a heating unit, which is arranged in such a way that the air flow that can be produced by the fan unit flows around the heating unit and subsequently flows to the lifting mechanism; and
   a control unit, which is designed for the purpose of operating the fan unit or the fan unit and the heating unit as a function of supplied weather data, with respect to ambient temperature and ambient humidity, wherein the control unit is designed for the purpose of activating the fan unit or the fan unit and the heating unit, if a force, which is greater than a predefined force value, is applied for moving the lifting mechanism.

2. The charging device according to claim 1, wherein the charging device has a sensor device for supplying the weather data.

3. The charging device according to claim 1, wherein the charging device includes a communication unit.

4. The charging device according to claim 1, wherein the control unit is designed for the purpose of activating the fan unit or the fan unit and the heating unit for a predetermined time prior to an upcoming charging process.

5. The charging device according to claim 1, wherein the control unit is designed for the purpose of activating the fan unit or the fan unit and the heating unit, if a charging current goes below a predetermined charging current value during the charging of an electrical energy store of a motor vehicle.

6. The charging device according to claim 1, wherein the control unit is designed for the purpose of activating and deactivating the fan unit or the fan unit and the heating unit at predetermined cyclical intervals.

* * * * *